(12) United States Patent
Lai (10) Patent No.: US 8,030,102 B2
(45) Date of Patent: Oct. 4, 2011

(54) LED UNITS FABRICATION METHOD

(75) Inventor: Chih-Chen Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/777,411

(22) Filed: May 11, 2010

(65) Prior Publication Data

US 2011/0159615 A1  Jun. 30, 2011

(30) Foreign Application Priority Data

Dec. 28, 2009  (TW) ................ 98145400 A (51) Int. Cl.
  *H01L 21/00* (2006.01)
  *H01L 21/20* (2006.01)
(52) U.S. Cl. ........... 438/22; 438/29; 438/33; 438/479
(58) Field of Classification Search .......... None
  See application file for complete search history.

(56) References Cited

U.S. PATENT DOCUMENTS

| | | | |
|---|---|---|---|
| 6,163,557 A * | 12/2000 | Dunnrowicz et al. | 372/46.01 |
| 6,746,889 B1 * | 6/2004 | Eliashevich et al. | 438/33 |
| 6,818,532 B2 * | 11/2004 | Yeom et al. | 438/460 |
| 6,878,563 B2 * | 4/2005 | Bader et al. | 438/22 |
| 2003/0114017 A1 * | 6/2003 | Wong et al. | 438/778 |
| 2003/0189212 A1 * | 10/2003 | Yoo | 257/79 |
| 2009/0294784 A1 * | 12/2009 | Nakahara et al. | 257/98 |

* cited by examiner

*Primary Examiner* — Scott B Geyer
(74) *Attorney, Agent, or Firm* — Altis Law Group, Inc.

(57) ABSTRACT

A method for fabricating a plurality of individual light emitting diode units includes forming a GaN epitaxial layer on a sapphire substrate, forming a plurality of exhaust trenches on the GaN epitaxial layer, wherein the exhaust trenches define a plurality of individual light emitting diode units, forming a reflective layer on the GaN epitaxial layer, attaching the reflective layer to a conductive substrate, removing the sapphire substrate from the GaN epitaxial layer via a laser lift-off process, wherein a gas produced during the laser lift-off process is exhausted via the exhaust trenches, and dicing the conductive substrate along the exhaust trenches to form the plurality of individual light emitting diode units.

13 Claims, 9 Drawing Sheets

LED UNITS FABRICATION METHOD

TECHNICAL FIELD

The present disclosure relates generally to a LED units fabrication method.

DESCRIPTION OF RELATED ART

Light emitting diodes (LEDs) are well-known semiconductor devices that convert current into light. The color of the light (wavelength) emitted by an LED depends on the semiconductor materials used. Gallium-Nitride (GaN) has gained much attention, because it is found that GaN can be combined with indium to produce InGaN/GaN semiconductor layers that can emit green, blue, and ultraviolet light. This wavelength controllability enables an LED semiconductor designer to tailor material characteristics to achieve beneficial device characteristics. Accordingly, GaN-based opto-electronic device technology has rapidly evolved since their commercial introduction in 1994.

Sapphire substrates are typically used as a base in the fabrication of GaN-based LEDs. Fabricating LEDs on the sapphire substrate is typically performed by growing a GaN epitaxial layer on the sapphire substrate. Then, a plurality of individual devices, such as GaN-based LEDs, is fabricated on the GaN epitaxial layer using normal semiconductor processing techniques. The individual devices are then detached from the sapphire substrate. However, because the sapphire substrate is hard, chemically resistant, and has no natural cleave angles, it is very difficult to separate the individual devices from the sapphire substrate.

Recently, a laser lift-off (LLO) process has been introduced to remove the sapphire substrate from the individual devices. During the process, the sapphire substrate is irradiated from a rear side by a laser to decompose the GaN epitaxial layer, such that the sapphire substrate is removed. However, the thin GaN epitaxial layer may buckle or crack during the LLO process, because it is usually not strong enough to withstand a high-energy laser shock wave.

Thus, a method for fabricating LED units which overcomes the described limitations is desired.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
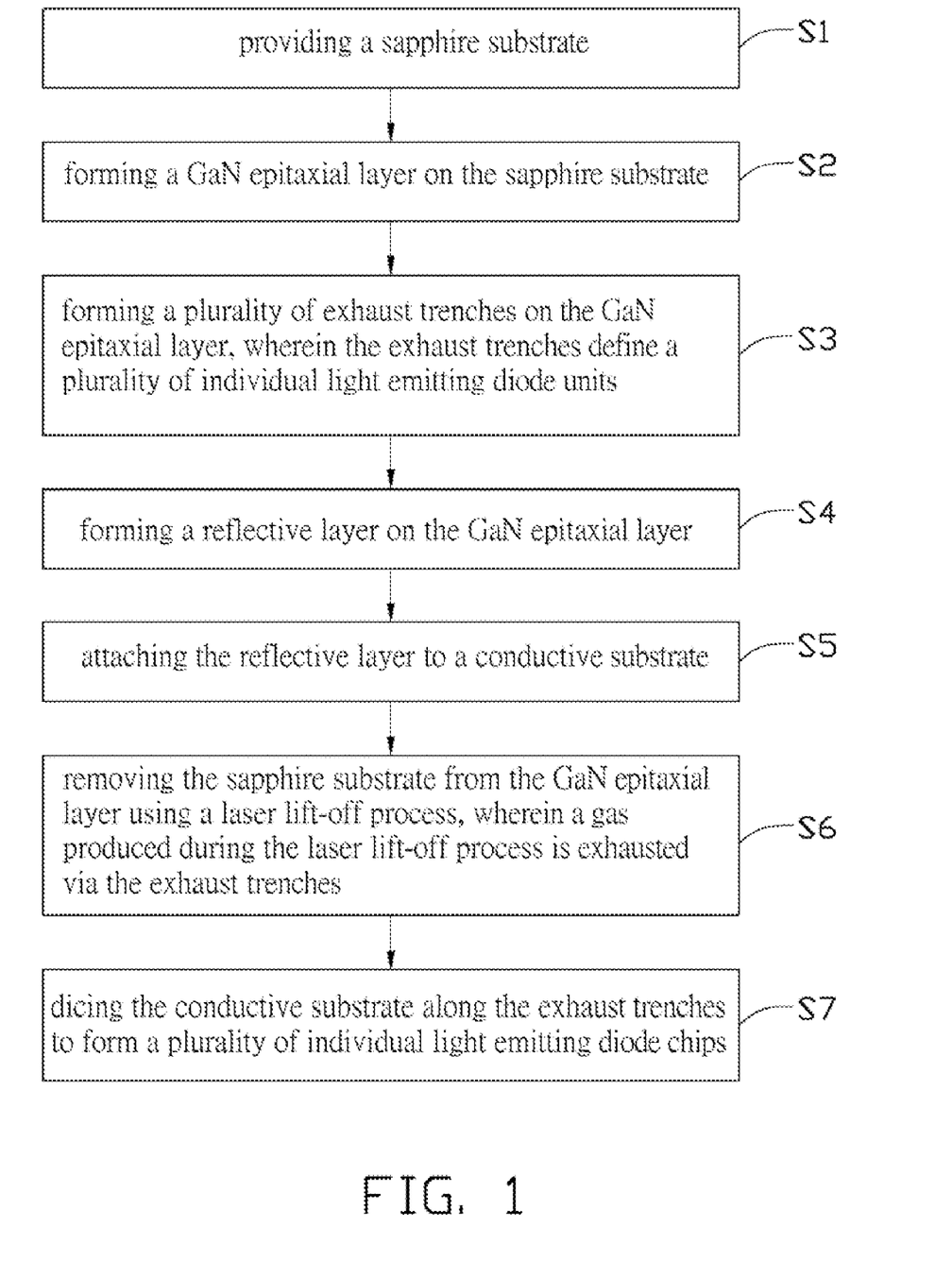
FIG. 1 is a flowchart of an embodiment of LED units fabrication method.

Referring to FIG. 1, an embodiment of a method for fabricating LED units is described as follows:

In step S1, a sapphire substrate 10, which has a round flat surface, is provided.

Figure 2:
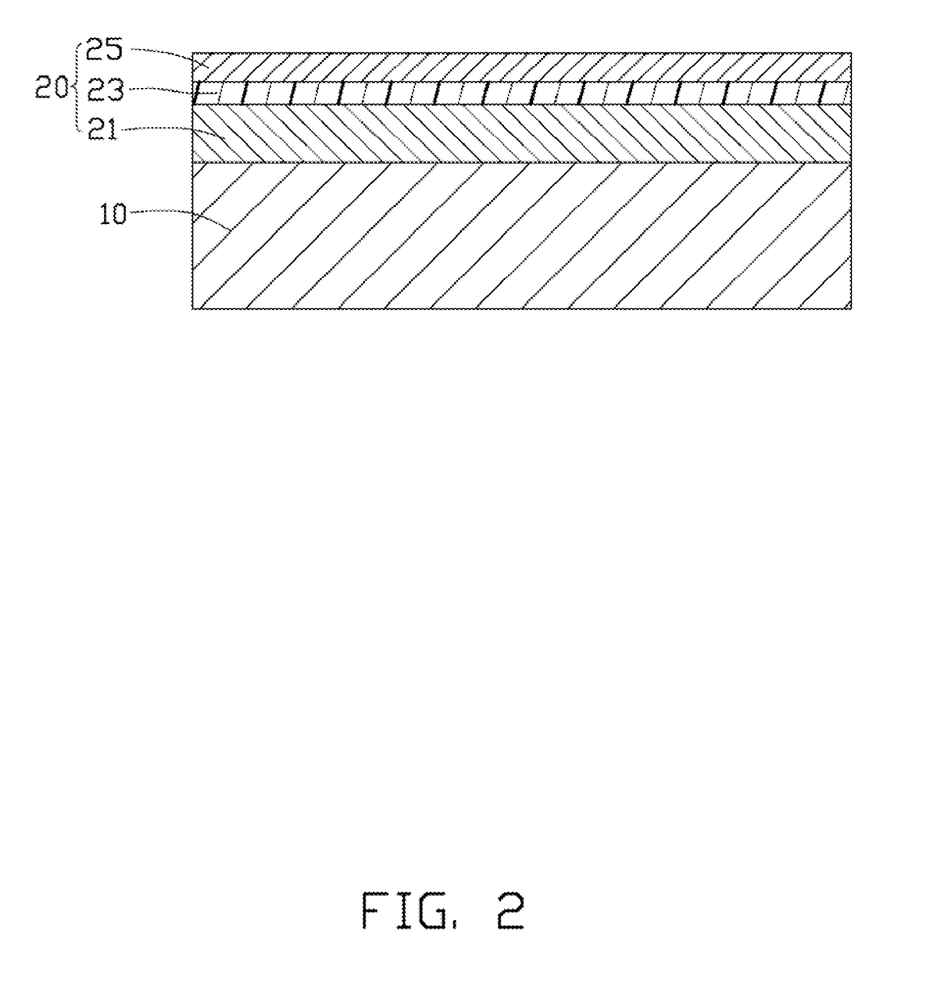
FIG. 2 through FIG. 7 are schematic, partial cross-sections of at least a part of LED units fabricated using the method of FIG. 1, with each of FIG. 2 through FIG. 7 relating to at least one step of the method of FIG. 1.

In step S2, referring to FIG. 2, a GaN epitaxial layer 20 is formed on the flat surface of the sapphire substrate 10. In one embodiment, the GaN epitaxial layer 20 is formed using metal organic chemical vapor deposition (MOCVD). The GaN epitaxial layer 20 includes a lamination of an n-GaN layer 21, an active layer 23, and a p-GaN layer 25. In alternative embodiments, the GaN epitaxial layer 20 may also be formed with other appropriate epitaxial growth methods, such as molecular beam epitaxy (MBE) or hydride vapor phase epitaxy (HVPE).

Figure 3:
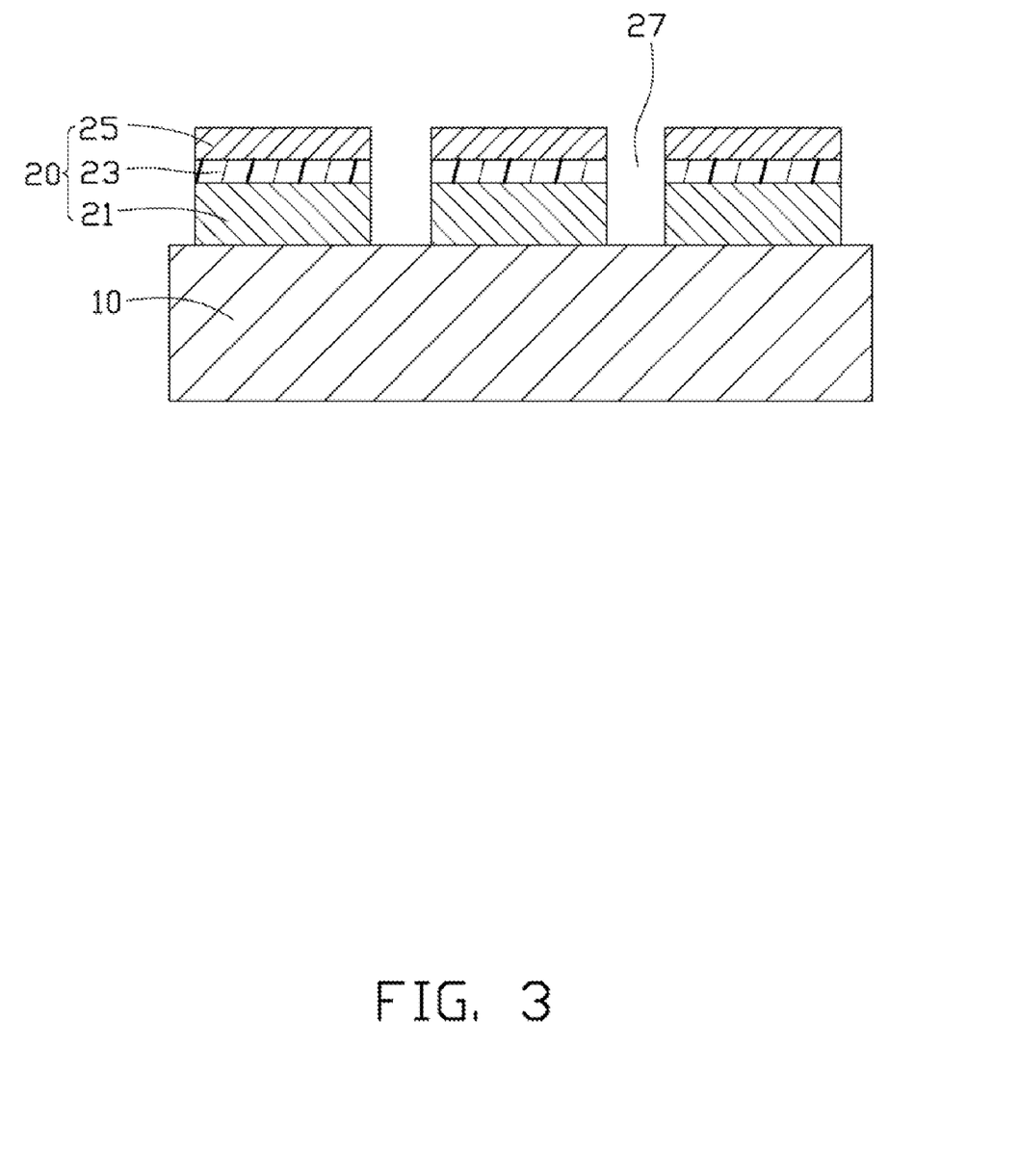
Figure 8:
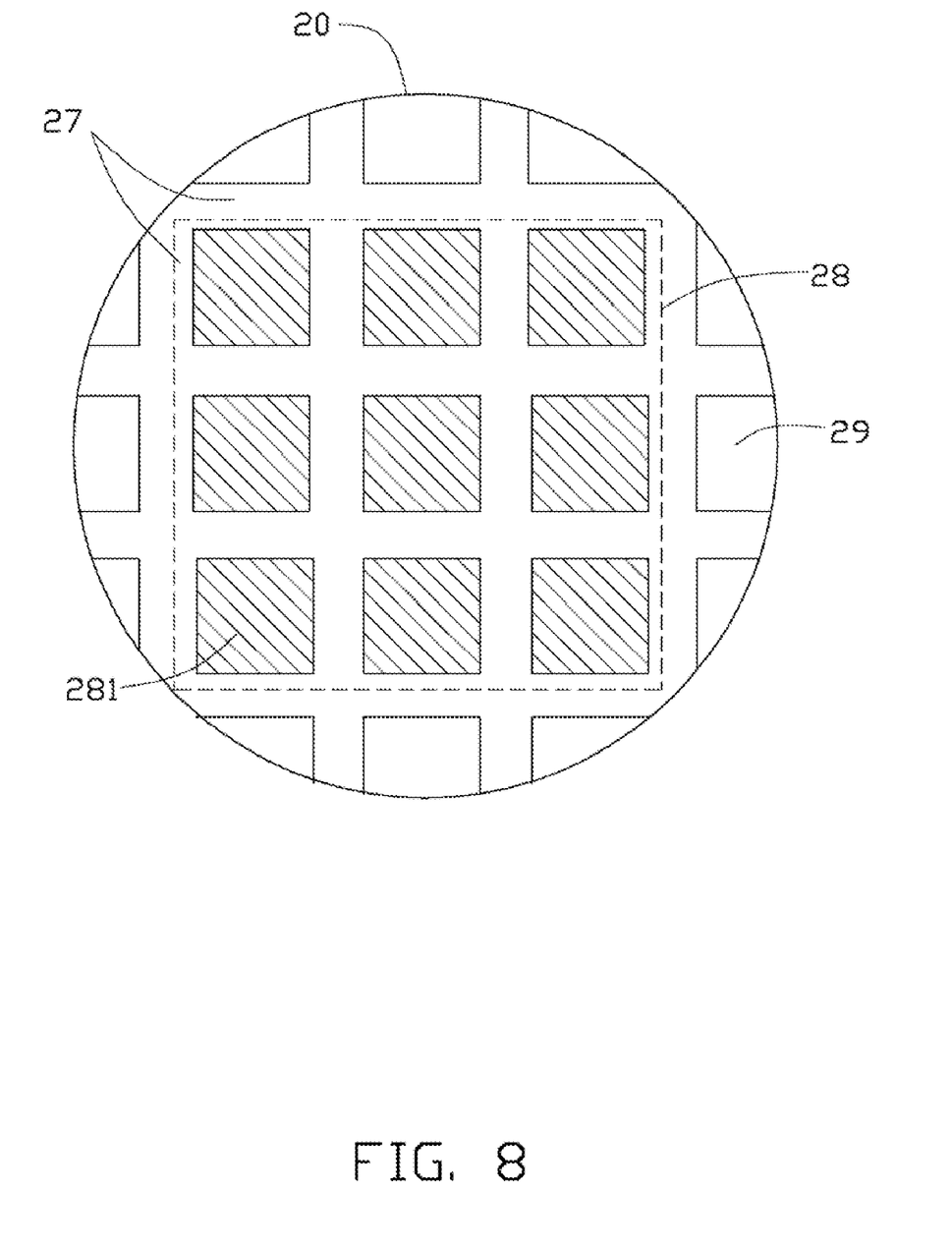
FIG. 8 is a schematic, top down view of the GaN epitaxial layer showing formation of a plurality of exhaust trenches.

In step S3, referring to FIG. 3, a plurality of exhaust trenches 27 is formed in the GaN epitaxial layer 20 using reactive ion etching, preferably inductively coupled plasma (ICP) reactive ion etching. The exhaust trenches 27 pass through the n-GaN layer 21, the active layer 23 and the p-GaN layer 25 of the GaN epitaxial layer 20. A width of each exhaust trench 27 is preferably in a range from about 10 microns ($\mu m$) to 500 $\mu m$. Referring also to FIG. 8, the plurality of exhaust trenches 27 is arranged substantially perpendicular to each other, and defines a preserve region 28 in a middle portion of the GaN epitaxial layer 20 (bounded by a broken line) and a sacrifice region 29 in a marginal portion of the GaN epitaxial layer 20 surrounding the preserve region 28. In the preserve region 28, the exhaust trenches 27 further define a plurality of individual LED units 281 having the same shape. Each of the individual LED units 281 is beneficially a square having a width in a range from about 100 $\mu m$ to about 2000 $\mu m$. The individual LED units 281 are arranged in a matrix defined by the exhaust trenches 27. Formation of the exhaust trenches 27 includes forming scribe lines and etching. Scribe lines are formed on the GaN epitaxial layer 20 using a photo-resist coating, which is beneficially fabricated from a relatively hard photo-resist material that withstands intense plasma. The photo-resist coating is then patterned to form the scribe lines. The GaN epitaxial layer 20 is then etched along the scribe lines using an ICP etcher to form the exhaust trenches 27. In alternative embodiments, the exhaust trenches 27 may be formed using other etching methods such as chemical etching.

Figure 4:
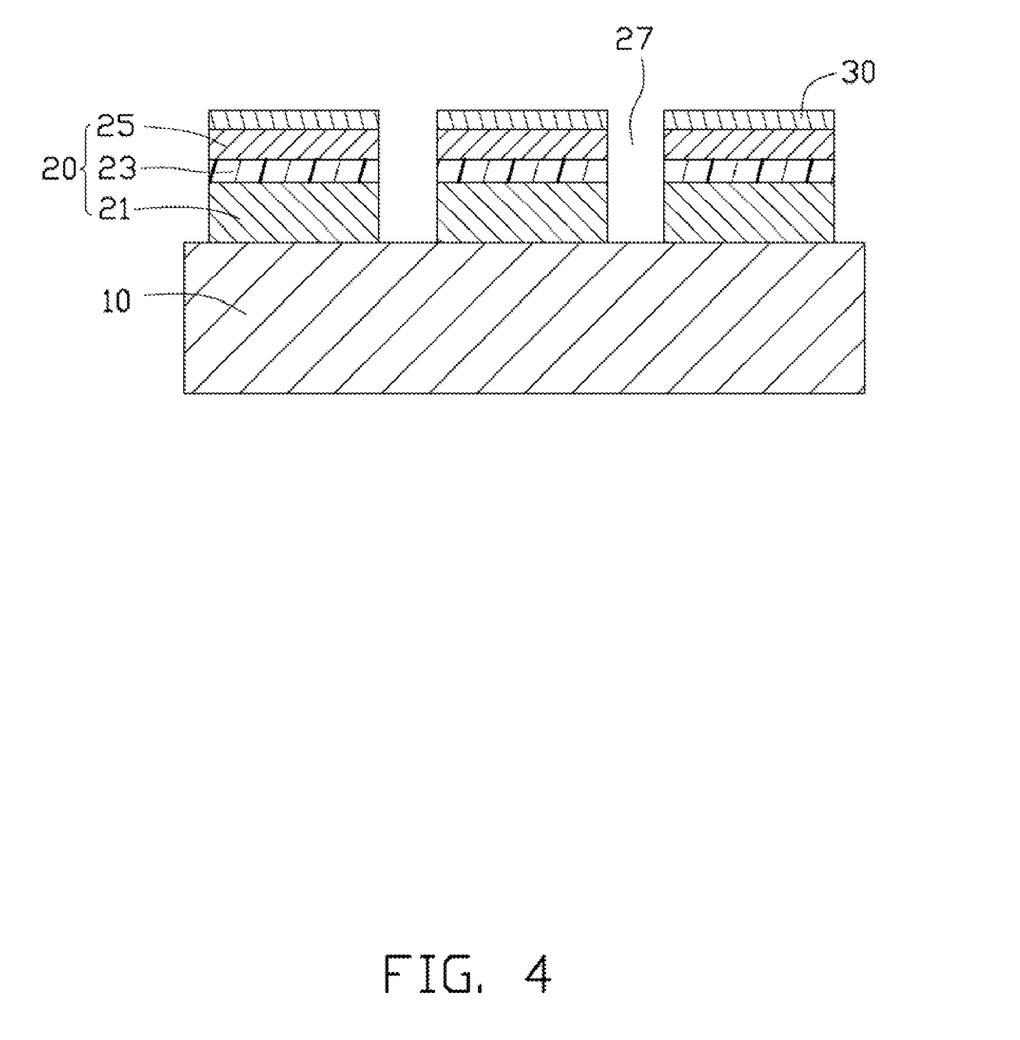

In step S4, referring to FIG. 4, a reflective layer 30 is formed on the GaN epitaxial layer 20 using plasma-enhanced chemical vapor deposition (PECVD). The reflective layer 30 may be a Prague reflective layer, or a metal reflective layer comprising Ag, Ni, Al, Cu, or Au. The reflective layer 30 is configured to reflect light generated in the active layer 33 to direct the light towards the n-GaN layer 21. In alternative embodiments, the reflective layer 30 may be formed using physical vapor deposition (PVD), sputtering, electroplating, or other suitable means. It should be noted that, during the formation, a photo-resist or a mask can be used to prevent the reflective layer 30 from forming in the exhaust trenches 27.

Figure 5:
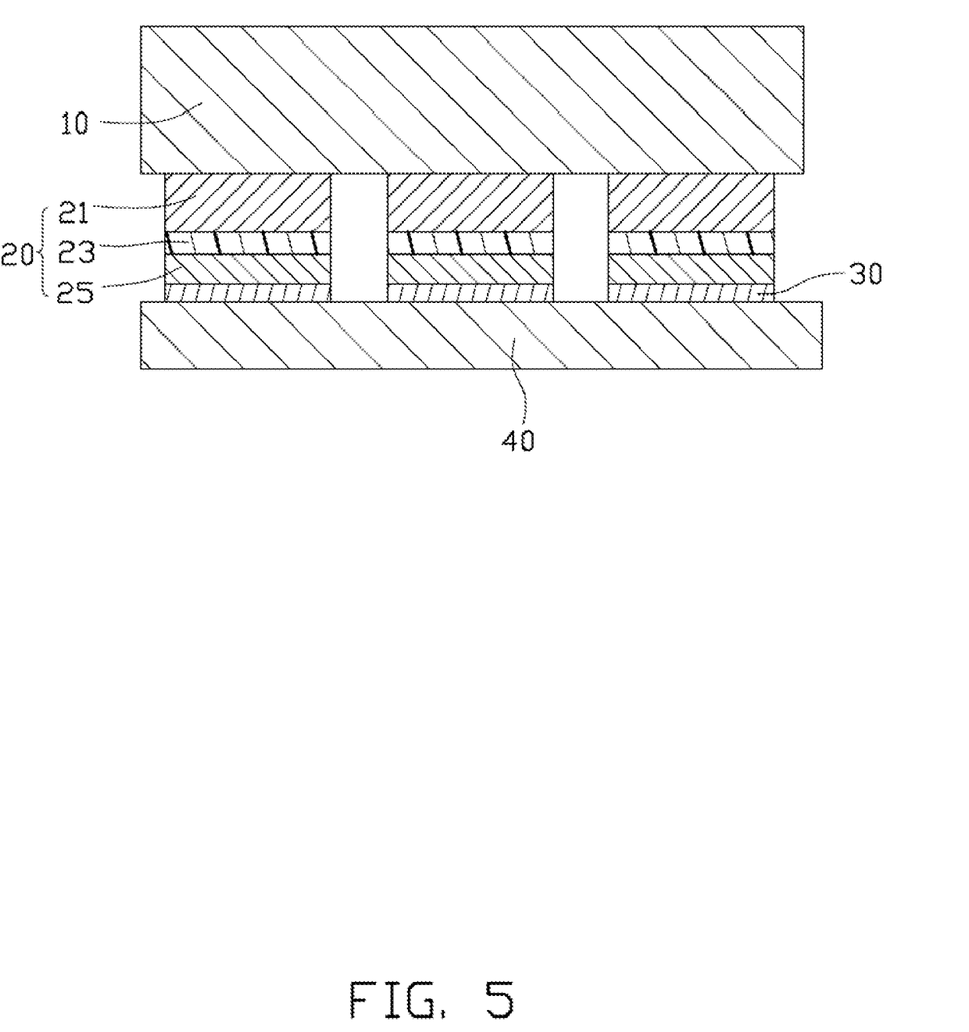

In step S5, referring to FIG. 5, the reflective layer 30 is attached to a conductive substrate 40 using wafer boding or electroplating. In this embodiment, a nickel layer is electroplated on the reflective layer 30 to form the conductive substrate 40.

Figure 6:
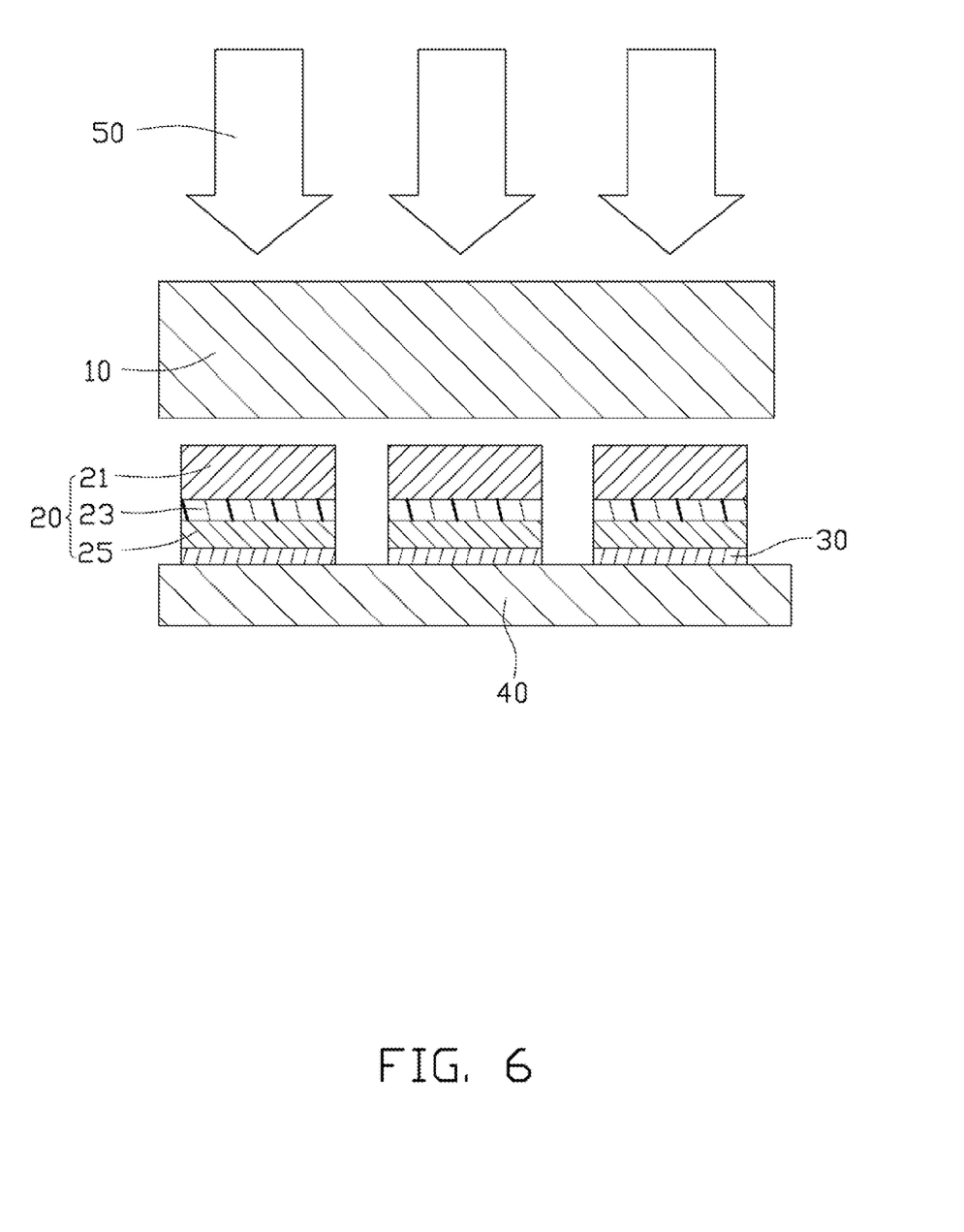

In step S6, referring to FIG. 6, the sapphire substrate 10 is removed form the GaN epitaxial layer 20 using an LLO process. In this embodiment, a laser beam 50 emitted by an excimer laser irradiates the sapphire substrate 10 from a side thereof without forming the GaN epitaxial layer 20. The laser beam 50 having a wavelength of about 300 nm almost completely passes through the sapphire substrate 10, and is then absorbed almost completely in the GaN epitaxial layer 20, whereby a temperature of an interface of the sapphire substrate 10 and the GaN epitaxial layer 20 rapidly rises. This result in decomposition of GaN into gallium and nitrogen and formation of a gap 11 between the sapphire substrate 10 and the GaN epitaxial layer 20. Nitrogen generated at this time can exhaust from the exhaust trenches 27, such that cracks on the GaN epitaxial layer 20 can be effectively reduced with no pressure applied to the individual LED units 281. After the removal of the sapphire substrate 10, excessive gallium is drained by acid etching or the like.

Figure 9:
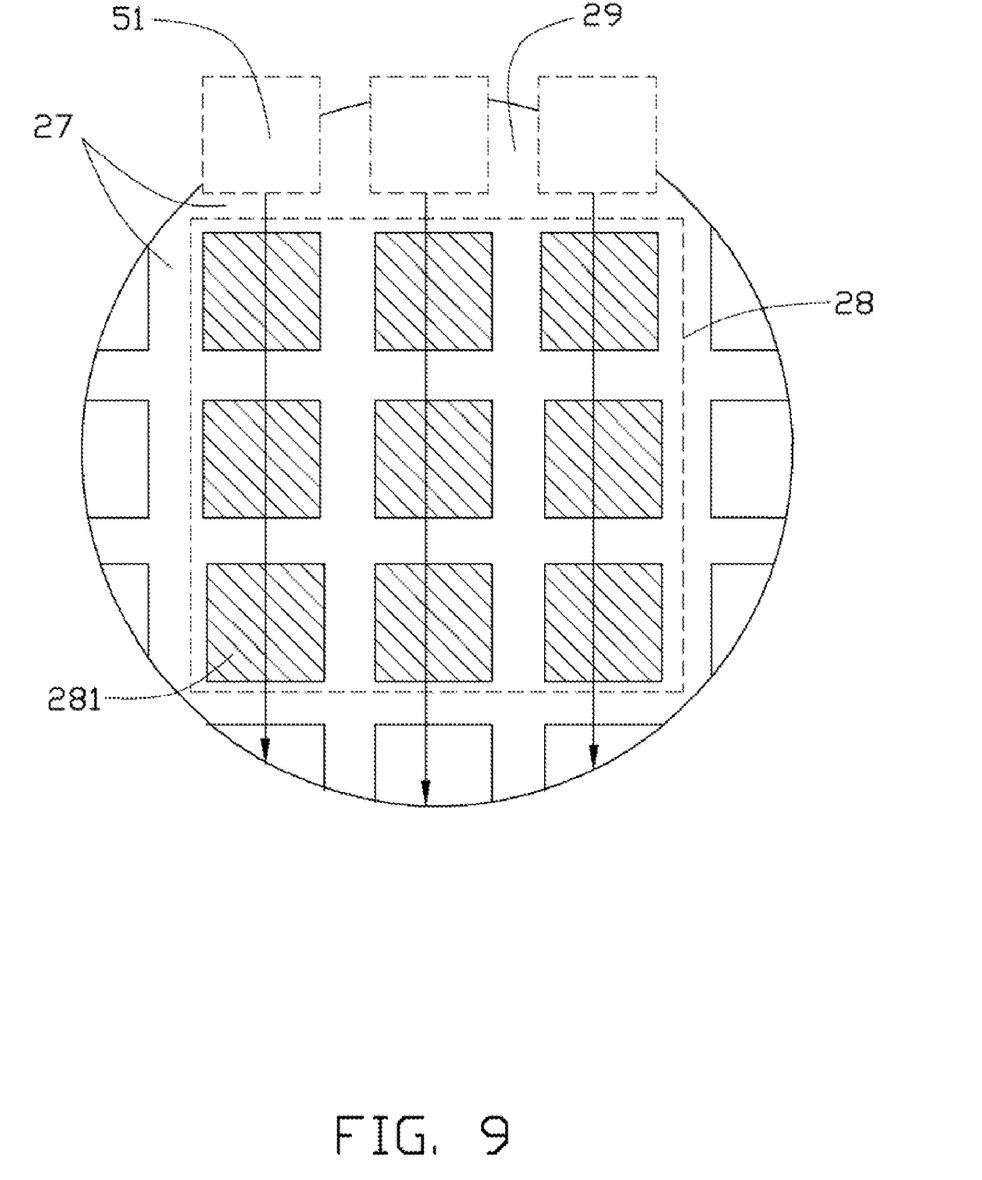
FIG. 9 is a schematic, top down view of the GaN epitaxial layer during the laser lift-off process.

Referring also to FIG. 9, in order to increase the efficiency of the laser, the laser beam 50 projects a light spot 51 on the GaN epitaxial layer 20. The light spot 51 is substantially square, and of the same size as that of the individual LED unit 281. The LLO process further includes:

Projecting an initial light spot 51 on a marginal portion of the sacrifice region 29 aligned with a first row of the individual LED units 281. The initial light spot 51 intercrosses a rim of the GaN epitaxial layer 20, in other words, part of the initial light spot 51 extends beyond the GaN epitaxial layer 20. Accordingly, the gap 11 formed by the initial light sport 51 directly communicates with the environment, and nitrogen generated at this time can also exhaust from the gap 11.

Moving the initial light spot 51 along the exhaust trench 27 downward into the preserve region 28, thus scanning one individual LED unit 281 of the first row. Because the initial light spot 51 is aligned with the first row, and the initial light spot 51 has the same shape and size of the individual LED unit 281, the initial light spot 51 can entirely cover the individual LED unit 281, such that the whole of the individual LED unit 281 separates the sapphire substrate 10 immediately.

Continuing moving the initial light spot 51 along the exhaust trench 27 and scanning each individual LED unit 281 in the first row.

When the initial light spot 51 passes through the preserve region 28 and reaches another sacrifice region 29, stopping emission of the laser beam 50.

Adjusting the excimer laser such that a new light spot 51 is projected on the original sacrifice region 29 aligned with a second row of the individual LED units 281. The second row is adjacent to the first row.

Repeating movement of the initial light spot 51 until each row of the individual LED units 281 is scanned.

Figure 7:
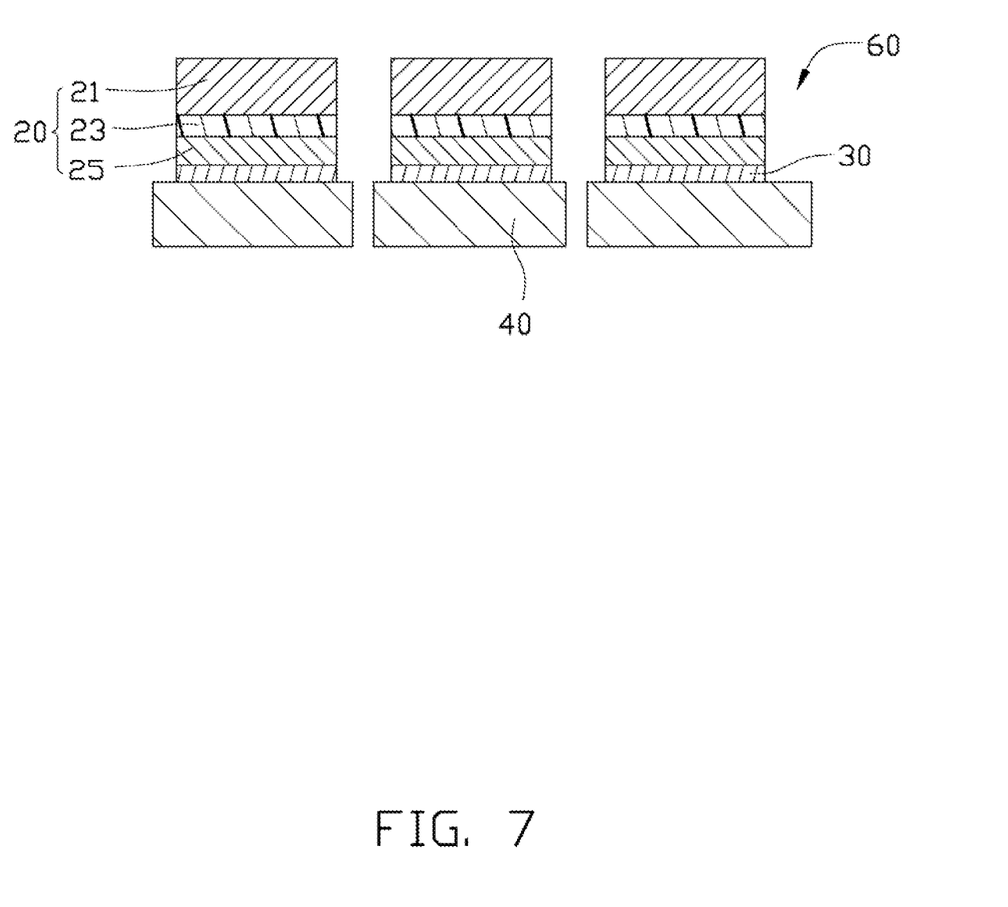

In step S7, referring to FIG. 7, the conductive substrate 40 is cut along the exhaust trenches 27 to be separated into chip-shaped pieces by dicing or the like. The GaN epitaxial layer 20 in the sacrifice region 29 is discarded, and a plurality of individual vertical topology GaN LED units 60 are then obtained by the individual LED units 281 in the preserve region 28.

The present method for fabricating LED units 60 includes forming a plurality of exhaust trenches 27 on the GaN epitaxial layer 20, such that nitrogen generated during the LLO process can be exhausted from the exhaust trenches 27. Thus, cracking caused by high-energy laser beam irradiation on the GaN epitaxial layer 20 is reduced, and fabrication yield of the LED units 60 can be increased.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A method for fabricating a plurality of individual light emitting diode units, comprising:
   providing a sapphire substrate;
   forming a GaN epitaxial layer on the sapphire substrate;
   forming a plurality of exhaust trenches on the GaN epitaxial layer, wherein the exhaust trenches define a plurality of individual light emitting diode units;
   forming a reflective layer on the GaN epitaxial layer;
   attaching the reflective layer to a conductive substrate;
   removing the sapphire substrate from the GaN epitaxial layer via a laser lift-off process, wherein a gas produced during the laser lift-off process is exhausted via the exhaust trenches; and
   dicing the conductive substrate along the exhaust trenches to form the plurality of individual light emitting diode units;
   wherein formation of the reflective layer comprises depositing a reflective layer on the GaN epitaxial layer using plasma-enhanced chemical vapor deposition.

2. The method of claim 1, wherein formation of the GaN epitaxial layer comprises forming an n-GaN layer, an active layer, and a p-GaN layer on the sapphire substrate in that order via a metal oxide chemical vapor deposition.

3. The method of claim 1, wherein formation of the exhaust trenches uses inductive couple plasma reactive ion etching.

4. The method of claim 1, wherein the exhaust trenches define a preserve region in a middle portion of the GaN epitaxial layer, and a sacrifice region in a marginal portion of the GaN epitaxial layer; wherein the plurality of individual light emitting diode units is formed in the preserve region.

5. The method of claim 4, wherein the plurality of individual light emitting diode units has the same shape, and is arranged in rows along the exhaust trenches.

6. The method of claim 5, wherein a light spot projected on the GaN epitaxial layer by a laser beam has the same shape and size as an individual light emitting diode unit during the laser lift-off process.

7. The method of claim 6, wherein the laser lift-off process further comprises:
   projecting an initial light spot on the sacrifice region adjacent to a first row of the individual light emitting diode units;
   moving the initial light spot along the exhaust trench into the preserve region, and scanning each individual light emitting diode units of the row one by one;
   stopping laser beam emission when the initial light spot passes through the preserve region;
   projecting a new light spot on the sacrifice region adjacent to a second row of the individual light emitting diode units, the second row being adjacent to the first row; and
   repeating movement of the initial light spot along the exhaust trench until each row of the individual light emitting diode units is scanned.

8. The method of claim 7, wherein the initial light spot entirely covers at least one individual light emitting diode unit during movement of the initial light spot.

9. The method of claim 7, wherein the initial light spot intercrosses a rim of the GaN epitaxial layer.

10. A method for fabricating a plurality of individual light emitting diode units, comprising:
    providing a sapphire substrate;
    forming a GaN epitaxial layer on the sapphire substrate;
    forming a plurality of exhaust trenches on the GaN epitaxial layer, wherein the exhaust trenches define a plurality of individual light emitting diode units;

forming a reflective layer on the GaN epitaxial layer;

attaching the reflective layer to a conductive substrate;

removing the sapphire substrate from the GaN epitaxial layer via a laser lift-off process, wherein a gas produced during the laser lift-off process is exhausted via the exhaust trenches; and dicing the conductive substrate along the exhaust trenches to form the plurality of individual light emitting diode units;

wherein the exhaust trenches define a preserve region in a middle portion of the GaN epitaxial layer, and a sacrifice region in a marginal portion of the GaN epitaxial layer; wherein the plurality of individual emitting diode units is formed in the preserve region;

wherein the plurality of individual light emitting diode units has the same shape, and is arranged in rows along the exhaust trenches; and wherein a light spot projected on the GaN epitaxial layer by a laser beam has the same shape and size as an individual light emitting diode unit during the laser lift-off process.

11. The method of claim 10, wherein the laser lift-off process further comprises:

projecting an initial light spot the sacrifice region adjacent to a first row of the individual light emitting, diode units;

moving the initial light spot along the exhaust trench into the preserve region, and scanning each individual light emitting diode units of the row one by one;

stopping laser beam emission when the initial light spot passes through the preserve region;

projecting a new light spot on the sacrifice region adjacent to a second row of the individual light emitting diode units, the second row being adjacent the first row; and repeating movement of the initial light spot along the exhaust trench until each row of the individual light emitting diode units is scanned.

12. The method of claim 11, wherein the initial light spot entirely covers at least one individual light emitting diode unit during movement of the initial light spot.

13. The method of claim 11, wherein the initial light spot intercrosses a rim of the GaN epitaxial layer.

* * * * *